(12) United States Patent
Mochizuki et al.

(10) Patent No.: US 11,316,015 B2
(45) Date of Patent: Apr. 26, 2022

(54) SILICON GERMANIUM FINFET WITH LOW GATE INDUCED DRAIN LEAKAGE CURRENT

(71) Applicant: INTERNATIONAL BUSINESS MACHINES CORPORATION, Armonk, NY (US)

(72) Inventors: Shogo Mochizuki, Mechanicville, NY (US); Kangguo Cheng, Schenectady, NY (US); Choonghyun Lee, Rensselaer, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 7 days.

(21) Appl. No.: 17/134,731

(22) Filed: Dec. 28, 2020

(65) Prior Publication Data
US 2021/0118998 A1  Apr. 22, 2021

Related U.S. Application Data

(62) Division of application No. 16/167,770, filed on Oct. 23, 2018, now Pat. No. 10,916,633.

(51) Int. Cl.
*H01L 29/76* (2006.01)
*H01L 29/161* (2006.01)
(Continued)

(52) U.S. Cl.
CPC ...... *H01L 29/161* (2013.01); *H01L 21/28088* (2013.01); *H01L 21/3065* (2013.01);
(Continued)

(58) Field of Classification Search
None
See application file for complete search history.

(56) References Cited

U.S. PATENT DOCUMENTS 8,053,841 B2   11/2011   Jang et al.
8,878,234 B2   11/2014   Gossner et al.
(Continued)

FOREIGN PATENT DOCUMENTS

WO   2017/111914 A1   6/2017

OTHER PUBLICATIONS

List of IBM Patents or Patent Applications Treated as Related dated Dec. 28, 2020, 2 pages.

*Primary Examiner* — Hung K Vu
(74) *Attorney, Agent, or Firm* — Tutunjian & Bitetto, P.C.; Samuel Waldbaum (57) ABSTRACT

A method for forming the semiconductor device that includes forming an etch mask covering a drain side of the gate structure and the silicon containing fin structure; etching a source side of the silicon containing fin structure adjacent to the channel region; and forming a germanium containing semiconductor material on an etched sidewall of the silicon containing fin structure adjacent to the channel region. Germanium from the germanium containing semiconductor material is diffused into the channel region to provide a graded silicon germanium region in the channel region having germanium present at a highest concentration in the channel region at the source end of the channel region and a germanium deficient concentration at the drain end of the channel region.

20 Claims, 9 Drawing Sheets

(51) Int. Cl.

| | |
|---|---|
| *H01L 21/308* | (2006.01) |
| *H01L 29/78* | (2006.01) |
| *H01L 29/66* | (2006.01) |
| *H01L 29/51* | (2006.01) |
| *H01L 21/28* | (2006.01) |
| *H01L 29/08* | (2006.01) |
| *H01L 29/10* | (2006.01) |
| *H01L 21/768* | (2006.01) |
| *H01L 21/3065* | (2006.01) |
| *H01L 29/49* | (2006.01) |

(52) U.S. Cl.
CPC .... *H01L 21/3086* (2013.01); *H01L 21/76829* (2013.01); *H01L 29/0847* (2013.01); *H01L 29/1033* (2013.01); *H01L 29/4966* (2013.01); *H01L 29/517* (2013.01); *H01L 29/66545* (2013.01); *H01L 29/66553* (2013.01); *H01L 29/785* (2013.01)

(56) References Cited

U.S. PATENT DOCUMENTS

| | | | |
|---|---|---|---|
| 8,895,395 B1 | 11/2014 | Kerber et al. | |
| 8,994,072 B2 | 3/2015 | Kerber et al. | |
| 9,425,257 B2 * | 8/2016 | Fung | H01L 29/785 |
| 9,577,043 B2 * | 2/2017 | Yoo | H01L 21/845 |
| 9,590,099 B2 | 3/2017 | Liu et al. | |
| 9,859,423 B2 | 1/2018 | Liu et al. | |
| 10,043,893 B1 | 8/2018 | Mulfinger et al. | |
| 2008/0128750 A1 * | 6/2008 | Enicks | H01L 27/092 |
| | | | 257/E21.403 |
| 2015/0228653 A1 | 8/2015 | Cheng et al. | |
| 2016/0064210 A1 | 3/2016 | Cheng et al. | |
| 2018/0261696 A1 * | 9/2018 | Glass | H01L 29/165 |

\* cited by examiner

SILICON GERMANIUM FINFET WITH LOW GATE INDUCED DRAIN LEAKAGE CURRENT

BACKGROUND

Technical Field

The present disclosure relates to semiconductor devices, such as semiconductor devices including fin structures.

Description of the Related Art

The dimensions of semiconductor field effect transistors (FETs) have been steadily shrinking over the last thirty years or so, as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate. With conventional planar FET scaling reaching fundamental limits, the semiconductor industry is looking at more unconventional geometries that will facilitate continued device performance improvements. One such class of device is a fin field effect transistor (FinFET).

SUMMARY

In one aspect, a method of forming a Fin field effect transistor (FinFET) is provided that includes a graded silicon germanium composition channel region and low gate induced drain leakage current. In one embodiment, the method of forming the semiconductor device includes forming a gate structure on a channel region of a silicon containing fin structure; and forming an etch mask covering a drain side of the gate structure and the silicon containing fin structure. The method may continue with etching a source side of the silicon containing fin structure adjacent to the channel region; and forming a germanium containing semiconductor material on an etched sidewall surface on the source side of the silicon containing fin structure adjacent to the channel region. Germanium may be diffused from the germanium containing semiconductor material into the channel region to provide a graded silicon germanium region in the channel region having germanium present at a highest concentration in the channel region at a source end of the channel region and a germanium deficient concentration at the drain end of the channel region. The method may further include forming source and drain regions.

In another aspect, a semiconductor device is provided that includes a graded silicon germanium composition channel region and low gate induced drain leakage current. The semiconductor device comprises a graded silicon germanium channel region having a greater concentration of germanium than silicon at a source end of the graded silicon germanium channel region and a germanium deficient composition at the drain end of the graded silicon germanium channel region. A gate structure present on the graded silicon germanium channel region. A source region is adjacent to the source end of the graded silicon germanium channel region; and a drain region is adjacent to the drain end of the graded silicon germanium channel region.

In another embodiment, a semiconductor device is provided that includes a graded silicon germanium channel region having germanium present at a highest concentration in the channel region at a source end of the graded silicon germanium channel region and a germanium deficient concentration at the drain end of the graded silicon germanium channel region. In some embodiments, a p-type source region adjacent to the source end of the graded silicon germanium channel region and a p-type drain region adjacent to the drain end of the graded silicon germanium channel region. In some embodiments, the germanium concentration at the source end of the channel region provides hole mobility that is higher than hole mobility when the source end of the channel region comprised entirely of silicon, and a silicon concentration at the drain end of the channel region provides resistance to gate induced drain leakage current when compared to a drain end including a germanium containing composition.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION OF THE PREFERRED EMBODIMENTS

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein form field effect transistor (FET) semiconductor device that includes a channel region a graded silicon germanium composition channel region and low gate induced drain leakage current. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. A FinFET is a semiconductor device that positions the channel region of the semiconductor device in a fin structure. The source and drain regions of the fin structure are the portions of the fin structure that are on opposing sides of the channel region of the fin structure.

As used herein, the term "channel" is the region underlying the gate structure and between the source and drain of a semiconductor device that becomes conductive when the semiconductor device is turned on. As used herein, the term "drain" means a doped region in semiconductor device located at the end of the channel, in which carriers are flowing out of the transistor through the drain. As used herein, the term "source" is a doped region in the semiconductor device, in which majority carriers are flowing into the channel.

In some embodiments, to increase carrier speed, i.e., hole speed, in p-type semiconductor devices the composition of the channel regions for FET type devices has incorporated germanium (Ge), e.g., silicon germanium (SiGe). In one example, silicon germanium (SiGe) can be a channel material for p-type FET semiconductor devices because of the high mobility/performance and lower threshold voltage provided by SiGe. However, a silicon germanium (SiGe) channel in conjunction with a high germanium (Ge) % source/drain SiGe results in high leakage current, as known as gate induced drain leakage (GIDL) current, due to band-to-band tunneling. Gate induced drain leakage (GIDL) current occurs due to the high electric field between the gate and the drain. Since it is basically due to the band to band tunneling in the reversed biased channel-drain, high-Ge-content SiGe channel FinFETs suffer from high GIDL current. High gate induced drain leakage (GIDL) current is unacceptable for low-power application, such as SRAM. Therefore, forming SiGe FinFET with reduced GIDL while maintaining transistor performance is advantageous. In high gate induced drain leakage (GIDL) designs, the silicon germanium (SiGe) channel has a uniform germanium profile under the gate region. In some embodiments, the methods and structures of the present disclosure can reduce if not substantially eliminate high gate induced drain leakage (GIDL) by providing a graded silicon germanium (SiGe) channel, in which the portion of the channel abutting the drain side is composed of a germanium (Ge) deficient composition. In this example, as silicon (Si) rich portion (larger band gap than that of SiGe channel) is formed on the drain side of the channel region to reduce gate induced drain leakage (GIDL). The methods and structures of the present disclosure are now discussed with more detail referring to FIGS. 1-8.

Figure 1A:
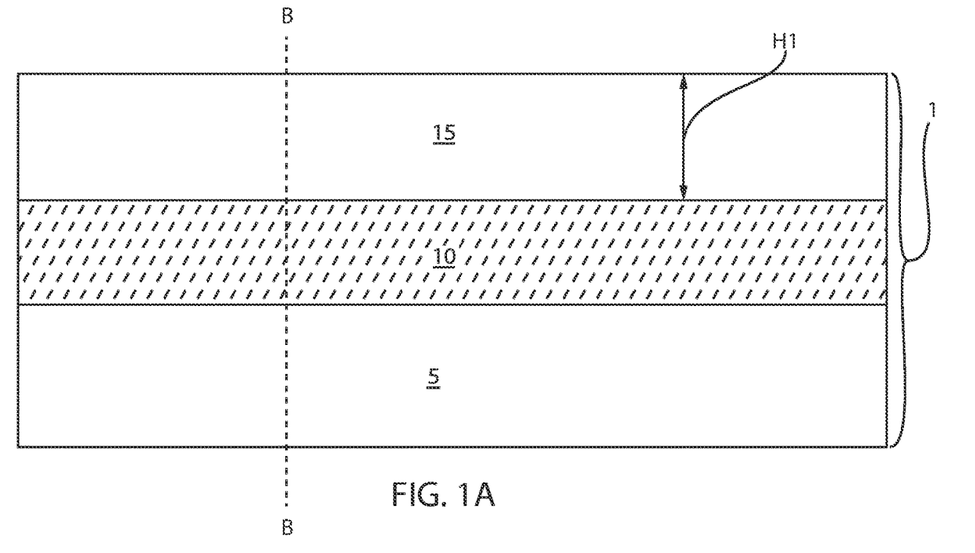
FIG. 1A is a side cross-sectional view depicting forming a fin structure from an SOI substrate, in which the cross section is along the length of the fin structure, in accordance with one embodiment of the present disclosure.
Figure 1B:
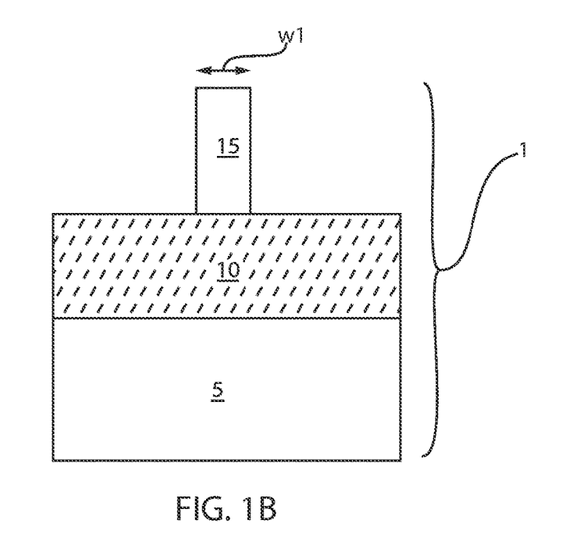
FIG. 1B is a side cross-section along section line B-B of the structure depicted in FIG. 1A.
Figure 2A:
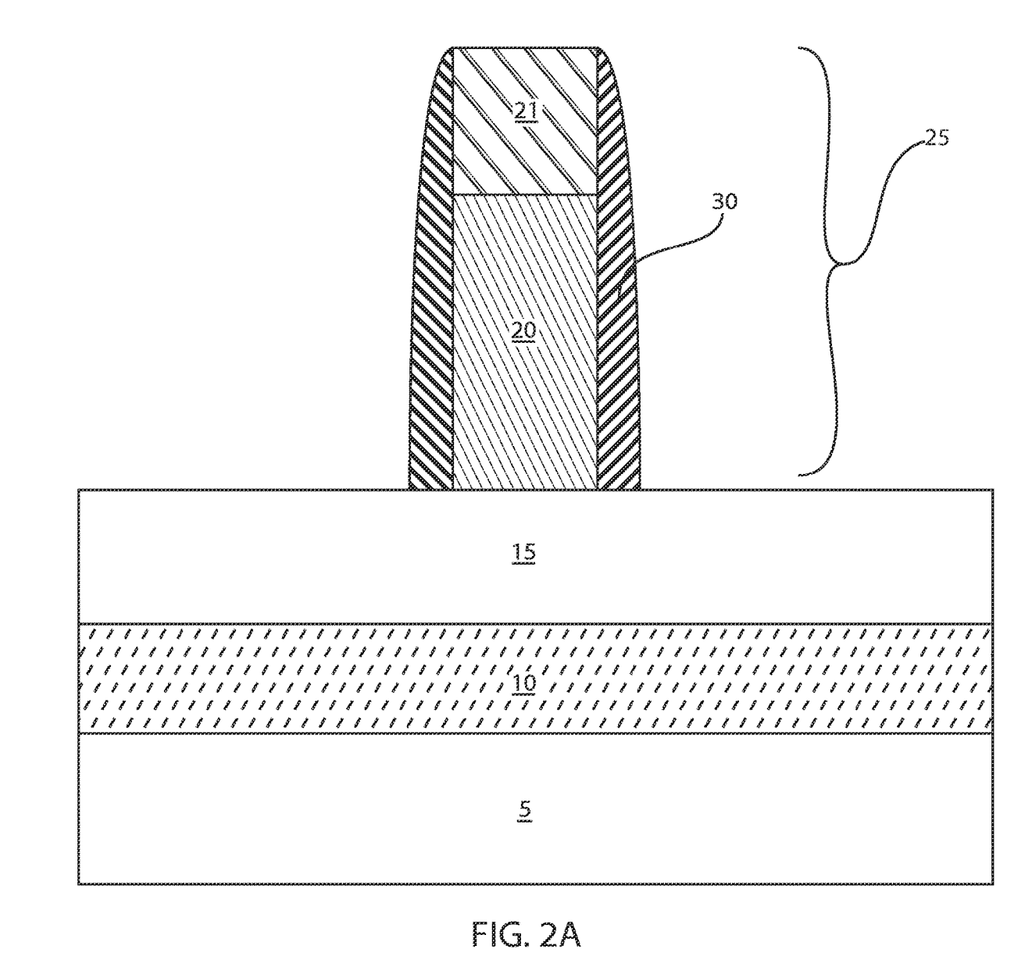
FIG. 2A is a side cross-sectional view of forming a gate structure, dielectric cap and spacer on the channel region of the fin structure depicted in FIG. 1A.
Figure 2B:
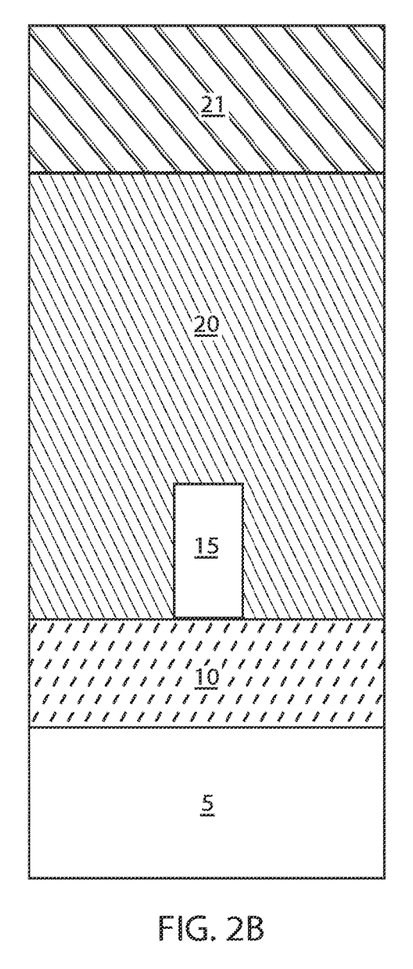
FIG. 2B is a side cross-sectional view of forming a gate structure, dielectric cap and spacer on the channel region of the fin structure depicted in FIG. 1B.

FIGS. 1A-1B depict one embodiment of forming a fin structure 15 from a semiconductor substrate 1. Although FIGS. 1-2B illustrate a single fin structure 15, any plurality of fin structures 15 may be formed on the substrate 1. In FIG. 1A, the fin structure 15 is formed from the semiconductor, e.g., silicon (Si), on insulator (SOI) layer over a semiconductor, e.g., silicon (Si), on insulator (SOI) substrate, in which the buried insulating layer 10, e.g., buried oxide layer (BOX), of the SOI substrate 1 is present underlying the fin structure 15, and a base supporting substrate 5 is present under the buried insulating layer 10. It is not necessary that the fin structure 15 be formed from the SOI layer of an SOI substrate. In some embodiments, the fin structure 15 may be formed from a bulk semiconductor substrate.

The fin structure 15 may be formed from the semiconductor substrate 1 using photolithography and etch processes. In one embodiment, the patterning process used to define each of the fin structures 15 is a sidewall image transfer (SIT) process. The SIT process can include forming a mandrel material layer (not shown) on the material layer that provides the fin structures 15, such as the SOI layer of an SOI substrate, or the bulk semiconductor substrate upper surface. The mandrel material layer can include any material (semiconductor, dielectric or conductive) that can be selectively removed from the structure during a subsequently performed etching process. In one embodiment, the mandrel material layer may be composed of amorphous silicon or polysilicon. In another embodiment, the mandrel material layer may be composed of a metal, such as, e.g., aluminum (Al), tungsten (W), or copper (Cu). The mandrel material layer can be formed by a deposition method, such as chemical vapor deposition or plasma enhanced chemical vapor deposition. Following deposition of the mandrel material layer, the mandrel material layer can be patterned by lithography and etching to form a plurality of mandrel structures on the topmost surface of the semiconductor containing material that provides the fin structures 15, e.g., the SOI layer of an SOI substrate.

In some embodiments, the SIT process may continue by forming a dielectric spacer on each sidewall of each mandrel structure. The dielectric spacer can be formed by deposition of a dielectric spacer material, and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, but are not limited to, chemical vapor deposition (CVD), plasma enhanced chemical vapor deposition (PECVD), or atomic layer deposition (ALD). Examples of etching that be used in providing the dielectric spacers include any etching process, such as, e.g., reactive ion etching (RIE). Since the dielectric spacers are used in the SIT process as an etch mask, the width of the each dielectric spacer determines the width of each fin structure 15.

In some embodiments, after formation of the dielectric spacers, the SIT process continues by removing each mandrel structure. Each mandrel structure can be removed by an etching process that is selective for removing the mandrel material as compared to silicon. Following the mandrel structure removal, the SIT process continues by transferring the pattern provided by the dielectric spacers into the semiconductor material layer that provides the fin structure 15, such as the SOI layer of an SOI substrate. The pattern transfer may be achieved by utilizing at least one etching process that can include dry etching, such as reactive ion etching (RIE), plasma etching, ion beam etching or laser ablation, chemical wet etch processes or a combination thereof. In one example, the etch process used to transfer the pattern may include one or more reactive ion etching (RIE) steps. The etching steps pattern the semiconductor material layer to provide the fin structure 15. Following etching, i.e., pattern transfer, the SIT process may conclude with removing the dielectric spacers using an etch process or a planarization process.

It is noted that the aforementioned spacer image transfer (SIT) process is only one method of forming a fin structure 15. In another embodiment, the fin structures 15 may be formed using a photoresist etch mask. Specifically, in one example, a photoresist mask is formed overlying the semiconductor composition layer which provides the fin structure 15. The exposed portions of the semiconductor layer that provides the fin structure 15 that are not protected by the photoresist mask are removed using a selective etch process. To provide the photoresist mask, a photoresist layer is first positioned on the semiconductor layer that provides the fin structure 15, e.g., SOI layer of an SOI substrate or upper surface of bulk semiconductor substrate. The photoresist layer may be provided by a blanket layer of photoresist material that is formed utilizing a deposition process such as, e.g., spin-on coating.

The blanket layer of photoresist material is then patterned to provide the photoresist mask utilizing a lithographic process that may include exposing the photoresist material to a pattern of radiation and developing the exposed photoresist material utilizing a resist developer. Following the formation of the photoresist mask, an etching process may remove the unprotected portions of the semiconductor layer that provides the fin structure 15. The etch process may be an anisotropic process, such as reactive ion etch (RIE).

Referring to FIGS. 1A and 1B, the fin structure 15 may have a height $H_1$ ranging from 5 nm to 200 nm. In another embodiment, the fin structure 15 may have a height $H_1$ ranging from 10 nm to 100 nm. In one example, the fin structure 15 may have a height $H_1$ ranging from 20 nm to 50 nm. The fin structure 15 may have a width Wi of less than 20 nm. In another embodiment, the fin structures 15 have a width Wi ranging from 6 nm to 8 nm. In embodiments including a plurality of fin structures 15, the pitch separating adjacent fin structures 15 may range from 10 nm to 500 nm.

In some embodiments, the fin structure 15 may be composed of a silicon including material that provides the semiconductor substrate 1, which may include, but is not limited to silicon, single crystal silicon, multicrystalline silicon, polycrystalline silicon, amorphous silicon, strained silicon, silicon doped with carbon (Si:C), silicon alloys or any combination thereof.

FIGS. 2A and 2B depict forming a sacrificial gate structure 25 on the structure depicted in FIGS. 2A and 2B. In one embodiment, the sacrificial gate structure 25 may be formed contacting the channel region of the fin structure 15. The term "sacrificial" as used to describe the replacement gate conductor denotes that the structure is present during the process sequence, but is not present in the final device structure, in which the replacement structure provides an opening that dictates the size and geometry of a later formed functional gate conductor.

The sacrificial material that provides the sacrificial gate electrode 20 of the sacrificial gate structure 25 may be composed of any material that can be etched selectively to the underlying fin structures 15. In one embodiment, the sacrificial material that provides the sacrificial gate electrode 20 may be composed of a silicon-containing material, such as polysilicon. Although, the sacrificial gate electrode 20 is typically composed of a semiconductor material, the sacrificial gate electrode 20 may also be composed of a dielectric material, such as an oxide, nitride or oxynitride material, or amorphous carbon.

The sacrificial material may be patterned and etched to provide the sacrificial gate electrode 20. Specifically, and in one example, a pattern is produced by applying a photoresist to the surface to be etched, exposing the photoresist to a pattern of radiation, and then developing the pattern into the photoresist utilizing a resist developer. Once the patterning of the photoresist is completed, the sections if the sacrificial material covered by the photoresist are protected to provide the sacrificial gate electrode 20, while the exposed regions are removed using a selective etching process that removes the unprotected regions. Following formation of sacrificial gate electrode 20, the photoresist may be removed.

In some embodiments, a dielectric cap 21 may be present atop the sacrificial gate electrode 20. The dielectric cap 21 may be a sacrificial structure, and may be composed of a nitride containing dielectric, such as silicon nitride.

At least one dielectric gate spacer 30 may then be formed on the sidewall of the sacrificial gate electrode 20 and the sidewall of the dielectric cap 21. In one embodiment, the dielectric gate spacer 30 may be formed by using a blanket layer deposition, such as CVD and/or ALD, and an anisotropic etch. The dielectric gate spacer 30 may have a conformal thickness. The at least one dielectric gate spacer 30 may be composed of a layer having a conformal thickness. The dielectric gate spacer 30 may have a thickness ranging from 2.0 nm to 15.0 nm, and may be composed of a dielectric, such as a nitride, oxide, oxynitride, or a combination thereof.

Figure 3:
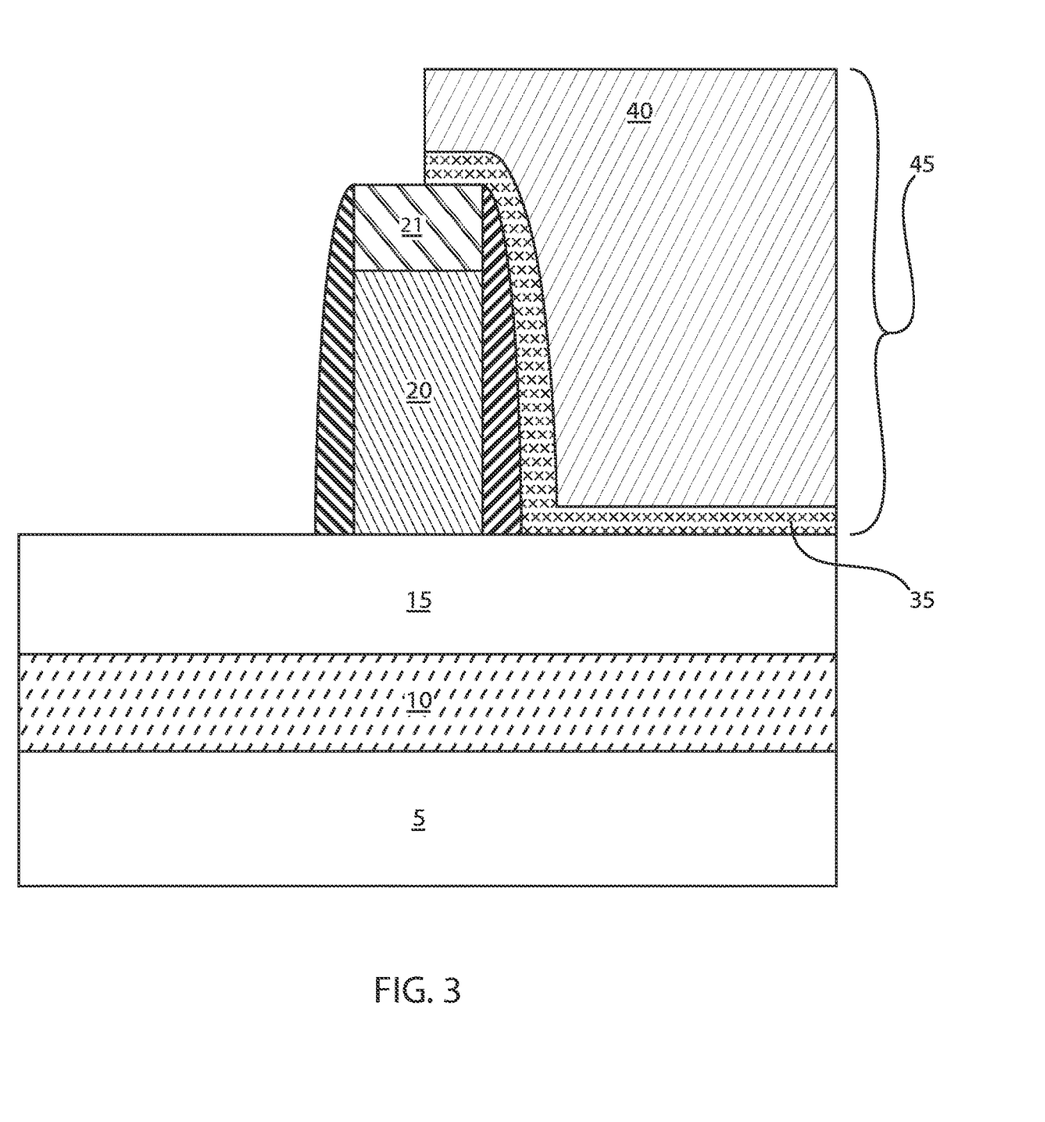
FIG. 3 is a side cross-sectional view depicting forming an etch mask over the structure depicted in FIG. 2A, the etch mask being formed by a process flow that includes blanket depositing a nitride containing layer; forming a photoresist layer over the nitride containing layer; patterning the photoresist layer to cover said drain side of the gate structure and the silicon containing fin structure; and removing a portion of the nitride containing layer not covered by a patterned photoresist layer and the gate structure with an etch process to expose the source side of the silicon containing fin structure.

FIG. 3 depict forming an etch mask 45 over the structure depicted in FIG. 2A, the etch mask 45 being formed by a process flow that includes blanket depositing a nitride containing layer 35; forming a photoresist layer 40 over the nitride containing layer 35; patterning the photoresist layer 40 to cover only the drain side of the gate structure 25 and the silicon containing fin structure 15; and removing a portion of the nitride containing layer 35 not covered by a patterned photoresist layer 40 and the gate structure 25 with an etch process to expose the source side of the silicon containing fin structure 15.

The nitride containing layer 35 may be blanket deposited using chemical vapor deposition (CVD) and/or ALD. Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed. The nitride containing layer 35 may be composed of silicon nitride. In other embodiments, the nitride containing layer 35 is composed of silicon oxynitride.

The photoresist layer 40 may be provided by a blanket layer of photoresist material that is formed utilizing a deposition process such as, e.g., spin-on coating. The blanket layer of photoresist material is then patterned to provide the photoresist layer 40 utilizing a lithographic process that may include exposing the photoresist material to a pattern of radiation and developing the exposed photoresist material utilizing a resist developer. Following the formation of the photoresist layer 40, an etching process may remove the unprotected portions of the nitride containing layer 35. The etch process may be an anisotropic process, such as reactive ion etch (RIE). The etch process can be selective to the dielectric cap 21, the dielectric gate spacer 30 and the fin structure 15.

Figure 4:
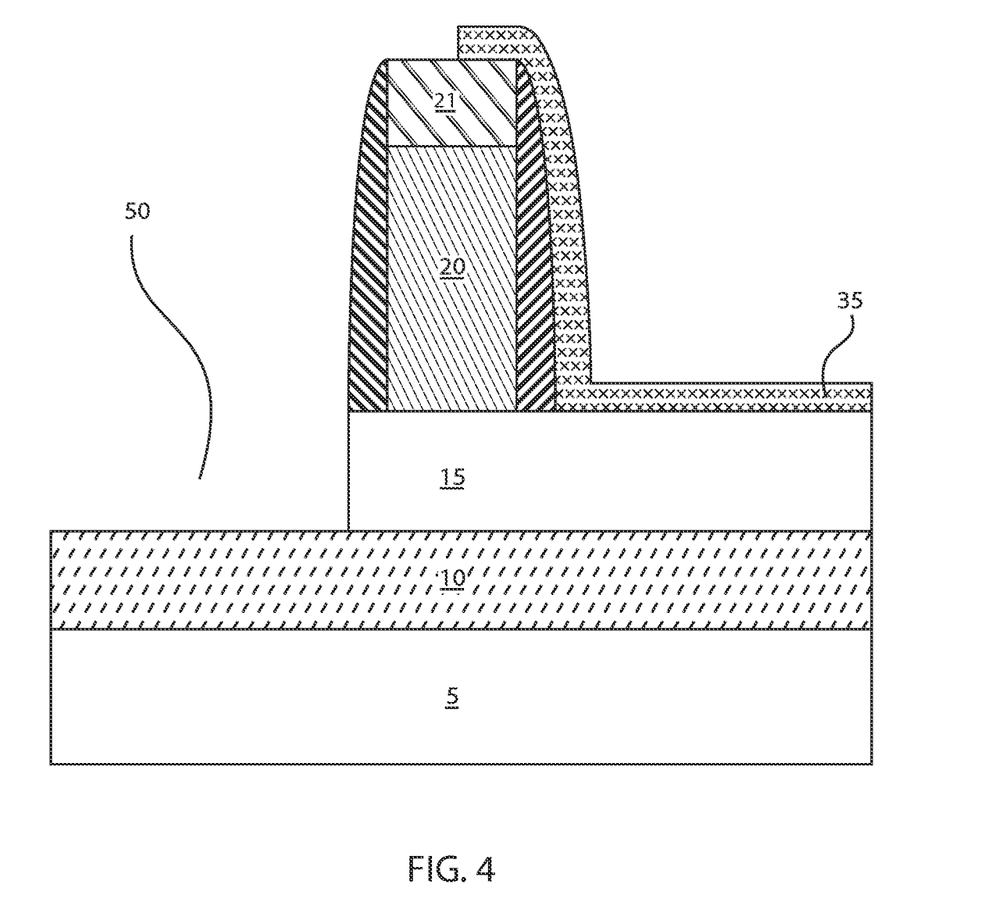
FIG. 4 is a side cross-sectional view depicting removing a source side of the silicon containing fin structure adjacent to the channel region, in accordance with one embodiment of the present disclosure.

FIG. 4 depicts etching a source side of the silicon containing fin structure 15 adjacent to the channel region; and forming a germanium containing semiconductor material 55 on an etched sidewall surface on the source side of the silicon containing fin structure adjacent to the channel region. The space provided by removing the source side of the silicon containing fin structure 15 may be referred to as a trench 50 formed on a source side of the fin structure 15 adjacent to the channel region. The etch process may be an anisotropic etch. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present invention include ion beam etching, plasma etching or laser ablation. The etch process may be selective to the buried oxide layer 10 of the substrate, the dielectric gate spacer 30 and the dielectric cap 21. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater. Following the etch process, the photoresist layer 40 may be removed.

Figure 5:
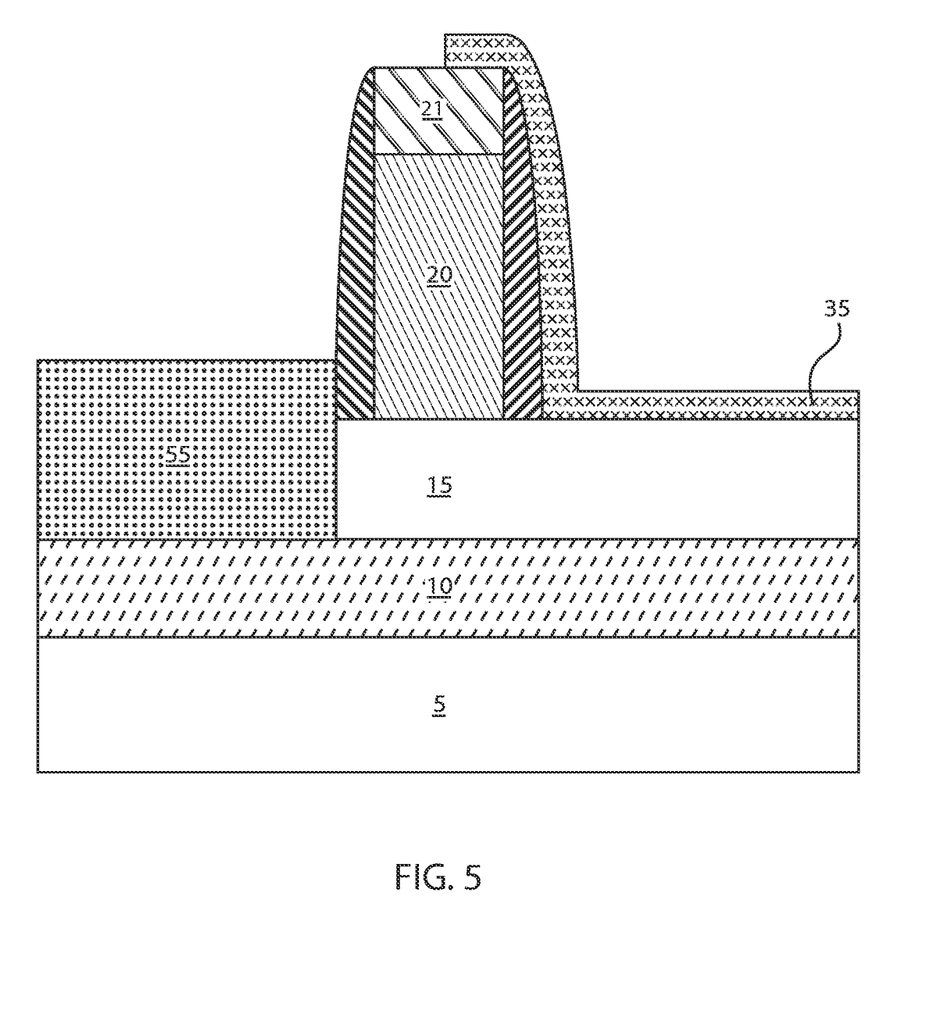
FIG. 5 is a side cross-sectional view depicting forming a germanium containing semiconductor material in the trench adjacent to the channel region.

FIG. 5 depicts forming a germanium containing semiconductor material 55 on an etched sidewall surface on the source side of the silicon containing fin structure 16 adjacent to the channel region. The germanium containing semiconductor material 55 may be formed in the trench 50 adjacent to the channel. The germanium containing semiconductor material 55 is formed using an epitaxial deposition process. Epitaxial growth and/or deposition" means the growth of a semiconductor material on a deposition surface of a semiconductor material, e.g., the exposed surface of the fin structures 15 having the first orientation, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, an epitaxial film deposited on a {100} crystal surface will take on a {100} orientation. The temperature for epitaxial deposition typically ranges from 350° C. to 900° C. Although higher temperature typically results in faster deposition, the faster deposition may result in crystal defects and film cracking.

The epitaxial deposition process is a selective forming process, which means the epitaxial material will be formed on semiconductor material, but will not form on dielectric material. In the embodiment depicted in FIG. 5, the epitaxial material for the germanium containing semiconductor material 55 will be formed on the exposed sidewall of the fin structure 15. More specifically, the epitaxial material for the germanium containing semiconductor material 55 will be formed on the exposed sidewall of the fin structure 15 that abuts the channel region portion of the fin structure underlying the gate structure 25. The epitaxial material will not be formed on the dielectric gate spacer 30, the dielectric cap 21 or the nitride containing layer 35 that is overlying the drain region side of the device.

The epitaxial material for the germanium containing semiconductor material 55 may 100% germanium (Ge). In other embodiments, the germanium containing material 55 may be a mixture of germanium (Ge) and silicon (Si). Examples of germanium including source gasses for epitaxially forming the germanium containing semiconductor material 55 includes germane, digermane, halogermane, dichlorogermane, trichlorogermane, tetrachlorogermane and combinations thereof.

Figure 6A:
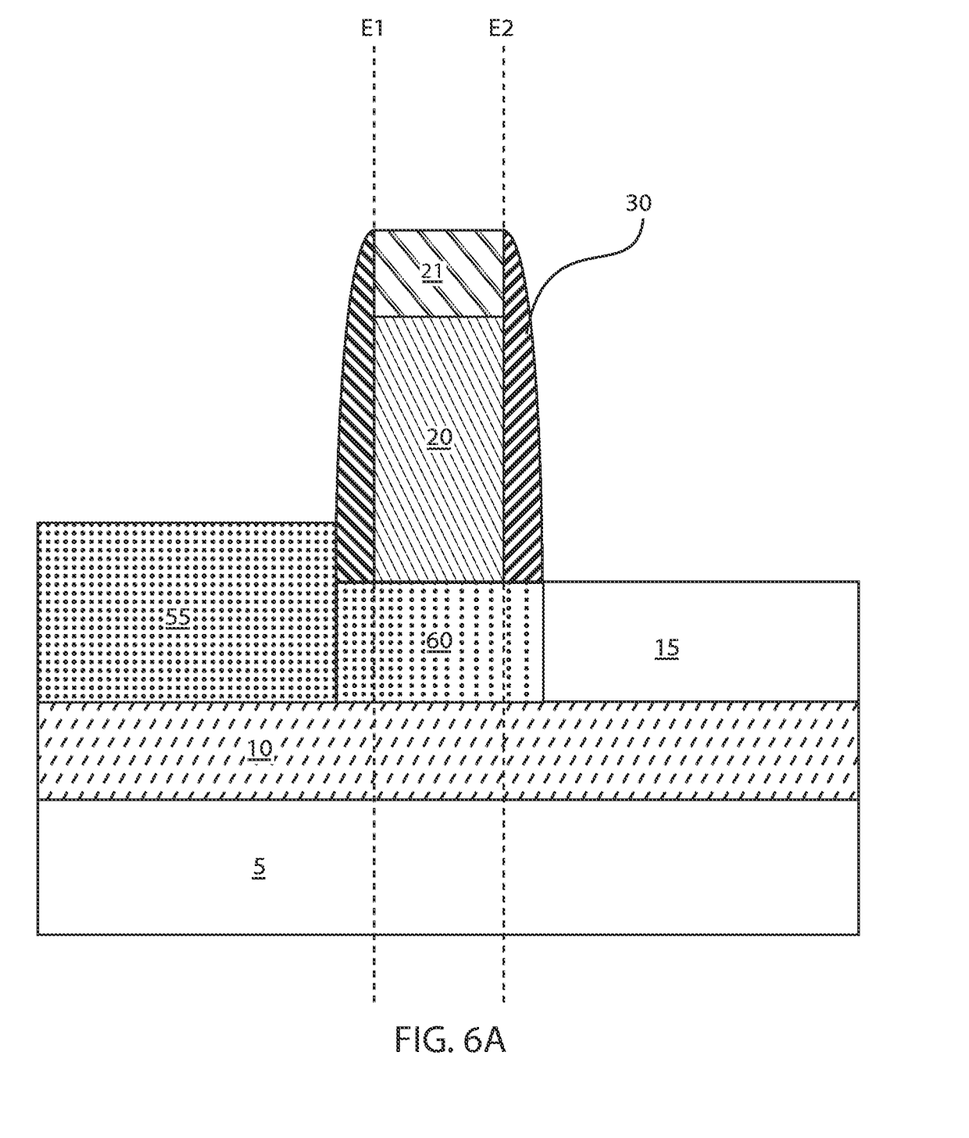
FIG. 6A is a side cross-sectional view depicting diffusing the germanium from the germanium containing semiconductor material into the channel region to provide a graded silicon germanium region in the channel region having a greater concentration of germanium than silicon at a source end of the channel region and a germanium deficient concentration at the drain end of the channel region, in accordance with one embodiment of the present disclosure.
Figure 6B:
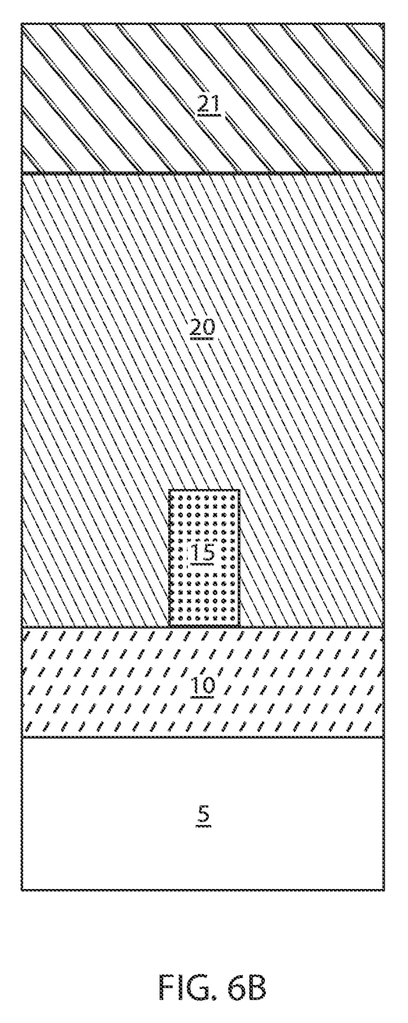
FIG. 6B is a side cross-section along section line E1 of the structure depicted in FIG. 6A.
Figure 6C:
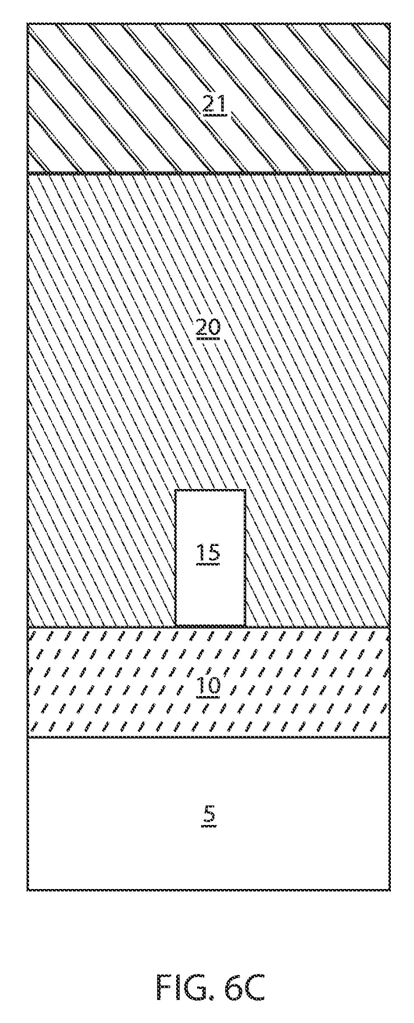
FIG. 6C is a side cross-section along section line E2 of the structure depicted in FIG. 6A.

FIGS. 6A-6C depict diffusing the germanium from the germanium containing semiconductor material 55 into the channel region to provide a graded silicon germanium region 60 in the channel region having germanium present at a highest concentration in the channel region at a source end E1 of the channel region and a germanium deficient concentration at the drain end E2 of the channel region. The germanium concentration at the source end E1 of the graded silicon germanium region 60 may range from 10% to 80%. In other examples, the germanium concentration at the source end E1 of the graded silicon germanium region 60 may range from 20% to 50%. Diffusion of the germanium from the germanium containing semiconductor material 55 may be by thermal diffusion. In one embodiment, diffusion of the germanium from the germanium containing semiconductor material 55 into the channel region to provide the graded silicon germanium region 60 includes annealing at a temperature ranging from 800° C. to 1050° C. In one embodiment, the annealing temperature may be 900° C. The annealing duration may range from seconds to minutes. For example, the annealing duration can be 1 to 2 minutes. In some embodiments, diffusion of the germanium from the germanium containing semiconductor material 55 into the channel region to provide the graded silicon germanium region 60 includes an annealing process that is selected from the group consisting of rapid thermal anneal, furnace anneal, laser anneal, and combinations thereof.

Referring to FIGS. 6A and 6B, the source end E1 of the channel region may have a germanium (Ge) concentration ranging from $5 \times 10^{21}$ atoms/cm$^3$ to $4 \times 10^{22}$ atom/cm$^3$. In another embodiment, the source end E1 of the channel region may have a germanium (Ge) concentration ranging from $1 \times 10^{22}$ atoms/cm$^3$ to $2.5 \times 10^{22}$ atom/cm$^3$. The term germanium (Ge) deficient means a semiconductor composition that is entirely free, i.e., 0%, of germanium (Ge). In some embodiments, a germanium deficient semiconductor material may be composed entirely, i.e., 100 wt. %, of silicon (Si), or close to 100 wt. %, of silicon (Si). FIG. 6C depicts a germanium deficient concentration semiconductor composition at the drain end E2 of the channel region.

The composition of germanium in the graded silicon germanium region 60 decreases substantially uniformly from a high germanium concentration at the source end E1 to substantially nothing, e.g., 0 wt. %, at the drain end E2 of the channel region at a rate of ranging from 5 to 30 nm per decade of germanium concentration depending on drive-in thermal budget. In one example, composition of germanium in the graded silicon germanium region 60 decreases substantially uniformly from a high germanium concentration at the source end E1 to substantially nothing, e.g., 0 wt. %, at the drain end E2 of the channel region at a rate of 10 nm per decade of germanium concentration depending on drive-in thermal budget.

Figure 7:
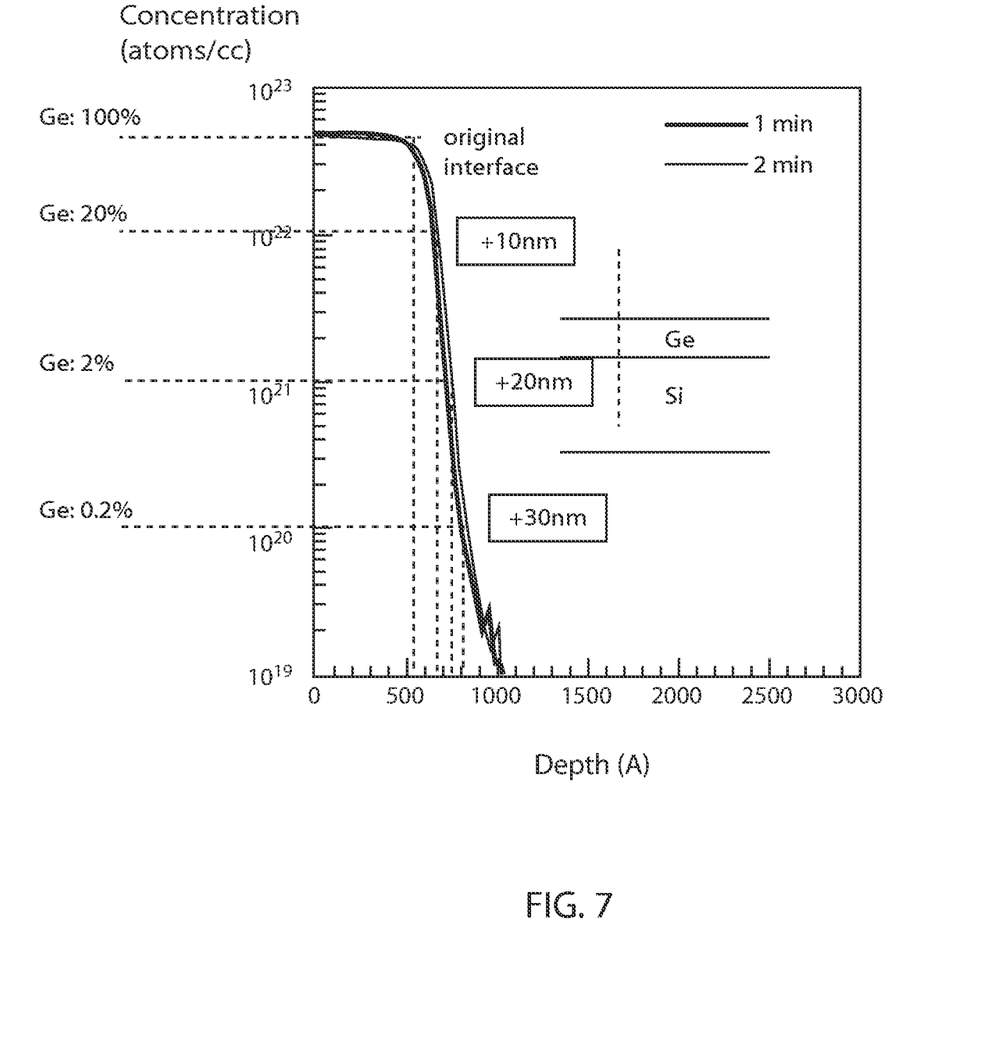
FIG. 7 is a plot illustrating diffusion performance of germanium.

FIG. 7 is a plot illustrating diffusion performance of germanium with thermal annealing at 900° C. according to the reference (P. Ranade et al., *ESL.* 5(2), G5 (2002)).

The germanium (Ge) present at the source end E1 of the channel can increase carrier speed, i.e., hole speed, in p-type semiconductor devices. In one example, silicon germanium (SiGe) can be a channel material for p-type FET semiconductor devices because of the high mobility/performance and lower threshold voltage provided by SiGe. The methods and structures of the present disclosure remove germanium (Ge) from the drain side of the channel. In prior devices, the presence of germanium (Ge) at the drain side of th channel resulted in high leakage current, as known as gate induced drain leakage (GIDL) current, due to band-to-band tunneling. The methods and structures of the present disclosure can reduce if not substantially eliminate high gate induced drain leakage (GIDL) by providing a graded silicon germanium (SiGe) channel 60, in which the portion of the channel abutting the drain side E1 is composed of a germanium (Ge) deficient composition. In this example, as silicon (Si) rich portion (larger band gap than that of SiGe channel) is formed on the drain side E1 of the channel region 60 to reduce gate induced drain leakage (GIDL).

Figure 8:
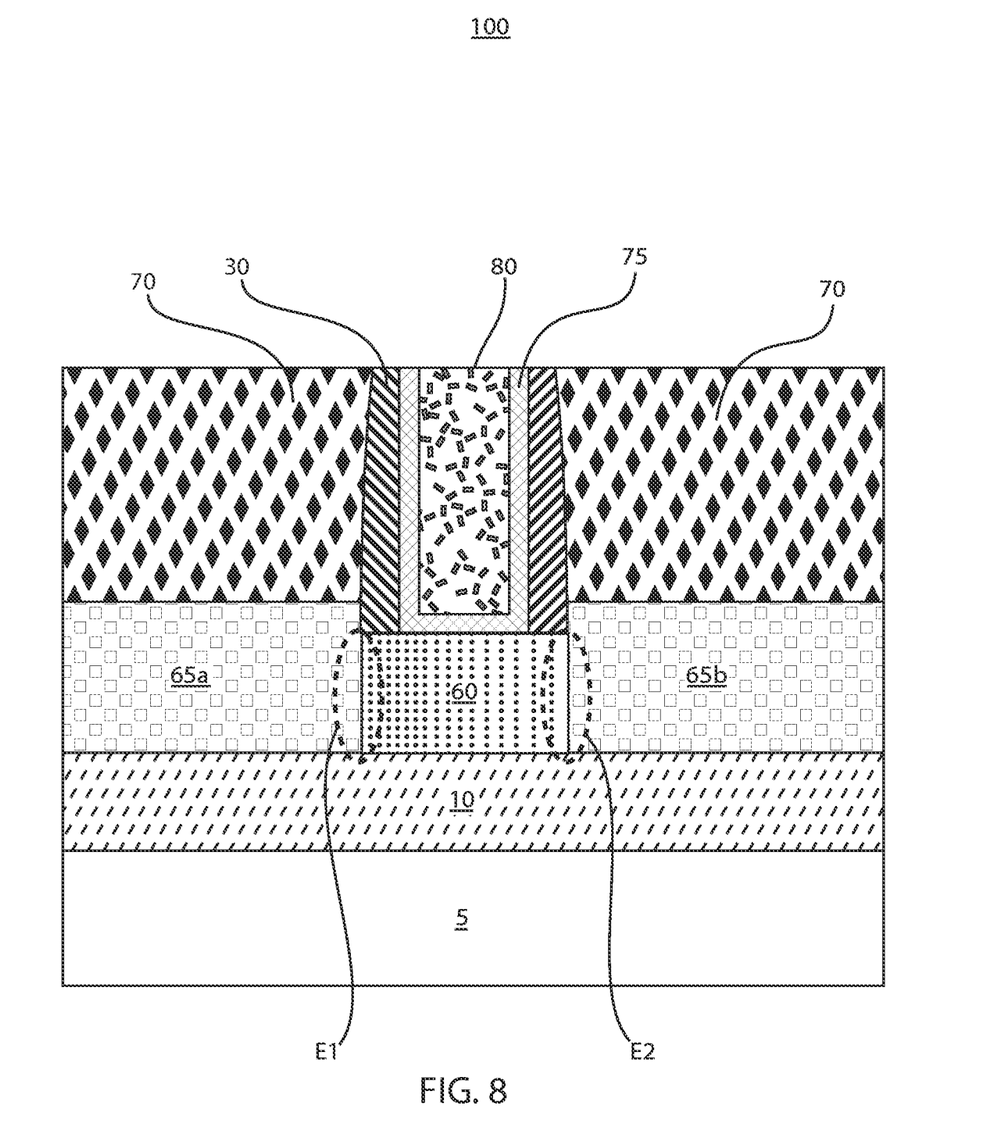
FIG. 8 is a side cross-sectional view depicting forming source and drain regions on the semiconductor device structure depicted in FIG. 6.

FIG. 8 depicting forming source and drain regions 65a, 65b on the semiconductor device structure depicted in FIG. 6. In one embodiment, forming source and drain regions 65a, 65b etching source/drain trenches into the source and drain portions of the fin structure on opposing sides of the gate structure 25; and epitaxially filling the trenches with n-type or p-type doped semiconductor material. First, the remaining portion of the nitride containing dielectric layer 35 is removed by a selective etch, which may be a dry etch and/or a wet etch. Thereafter, using the dielectric gate spacers 30 and the dielectric cap 21 as an etch mask, exposed portions of the germanium containing semiconductor material 55 and the drain portion of the fin structure 15 may be removed by an anisotropic etch, such as reactive ion etching.

Still referring to FIG. 8, the source and drain regions 65a, 65b may be epitaxially formed on the exposed sidewalls of the graded silicon germanium region 65a, 65b of the channel region for the device. The source and drain region portions 65a, 65b are doped to the conductivity type of the device. For example, if the FinFET is an n-type FinFET, the epitaxial source and drain region portions 65a, 65b are doped to an n-type conductivity; and if the FinFET is a p-type FinFET, the epitaxial source and drain region portions 65a, 65b are doped to a p-type conductivity.

In some embodiments, the epitaxial source and drain region portions 65a, 65b may be composed of silicon, germanium, silicon germanium, a silicon carbon alloy (e.g., silicon doped with carbon (Si:C), a silicon germanium and carbon alloy (e.g., silicon germanium doped with carbon (SiGe:C), silicon alloys, germanium, germanium alloys, gallium arsenic, indium arsenic, indium phosphide, as well as other III/V and II/VI compound semiconductors.

The dopant for the epitaxial source and drain region portions 65a, 65b may be introduced to the semiconductor material by an in situ doping process. The term "in situ" denotes that the dopant, e.g., n-type or p-type dopant, is introduced to the base semiconductor material, e.g., silicon or silicon germanium, during the formation of the base material. For example, an in situ doped epitaxial semiconductor material may introduce n-type or p-type dopants to the material being formed during the epitaxial deposition process that includes n-type or p-type source gasses. In one embodiment, the n-type gas dopant source may include arsine (AsH$_3$), phosphine (PH$_3$) and alkylphosphines, such as with the empirical formula R$_x$PH$_{(3-x)}$, where R=methyl, ethyl, propyl or butyl and x=1, 2 or 3. Alkylphosphines include trimethylphosphine ((CH$_3$)$_3$P), dimethylphosphine ((CH$_3$)$_2$PH), triethylphosphine ((CH$_3$CH$_2$)$_3$P) and diethylphosphine ((CH$_3$CH$_2$)$_2$PH). The p-type gas dopant source may include diborane (B$_2$H$_6$). The dopant for the epitaxial source and drain region portions 65a, 65b that dictates the conductivity type of the epitaxial source and drain region portions 65a, 65b is typically present in a concentration ranging from 5E19 atoms/cm$^3$ to 5E21 atoms/cm$^3$.

In a following process step, an interlevel dielectric layer 70 is formed having an upper surface that is coplanar with the upper surface of the sacrificial gate structure 25. The interlevel dielectric layer 70 may be selected from the group consisting of silicon containing materials such as SiO$_2$, Si$_3$N$_4$, SiO$_x$N$_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). The interlevel dielectric layer 70 may be deposited by chemical vapor deposition (CVD), physical vapor deposition (PVD), spin on deposition, deposition from solution or a combination thereof. Following deposition, the upper surface of the interlevel dielectric layer 70 may be planarized until coplanar with the upper surface of the sacrificial electrode 20. The planarization process may be provided by chemical mechanical planarization.

The sacrificial gate structure 20 may then be removed by an etch that is selective to the fin structures 15 and the interlevel dielectric layer 70. The etch may also be selective to the gate dielectric spacers 30. Removing the sacrificial gate structure 25 provides a gate structure opening to the channel region portion of the fin structures 5. The functional gate structure is formed in the gate structure opening.

The sacrificial gate electrode 20, as well as the dielectric cap 21, may be removed using a selective etch process. In some embodiments, the sacrificial gate electrode 20 may be removed by an anisotropic etch, such as reactive ion etching, or a wet etch.

A functional gate structure may then be formed in the gate opening. The "functional gate structure" operates to switch the semiconductor device from an "on" to "off" state, and vice versa. The functional gate structure may include a gate dielectric 75 and a gate electrode 80. The gate dielectric 75 may be a high-k gate dielectric 75. High-k dielectric materials, such as those used in the high-k gate dielectric 75, have a dielectric constant greater than silicon oxide ($SiO_2$). For example, high-k dielectrics having a dielectric constant greater than 4.0 at room temperature, e.g., 20° C. to 25° C. and atmospheric pressure, e.g., 1 atm. In one embodiment, the high-k gate dielectric 75 is composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the high-k gate dielectric 75 include hafnium silicate, hafnium silicon oxynitride or combinations thereof. In one embodiment, the high-k gate dielectric 75 may be deposited by chemical vapor deposition (CVD). In other embodiments, the high-k dielectric material layer 75 is deposited by atomic layer deposition.

The gate electrode 80 may be deposited atop the high-k gate dielectric material layer 75. In some embodiments, the gate electrode 80 is composed of a metal. In some embodiments, the metal may be a p-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In one embodiment, the p-type work function metal layer may be composed of titanium and their nitrided/carbide. In one embodiment, the p-type work function metal layer is composed of titanium nitride (TiN). Therefore, in some embodiments the metal may be titanium nitride (TiN), and may provide a p-type work function layer. In some other embodiments, the p-type work function metal layer is provided by a meal 80 that is composed of TiAlN, Ru, Pt, Mo, Co and alloys and combinations thereof.

In some other embodiments, the metal for the gate electrode 80 may be an n-type work function metal layer. As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV. In some embodiments, the n-type work function metal layer that provides the metal is composed of at least one of TiAl, TaN, TiN, HfN, HfSi, or combinations thereof. The gate electrode 80 may be formed using a deposition process. In some embodiments, the metal for the gate electrode 80 is formed using a physical vapor deposition (PVD) process, such as sputtering.

Referring to FIG. 8, in some embodiments, a semiconductor device is provided that may include a graded silicon germanium (SiGe) channel region 60 having germanium present at a highest concentration in the graded silicon germanium (SiGe) channel region 60 at a source end E1 of the graded silicon germanium channel region 60 and a germanium deficient semiconductor material at the drain end E2 of the graded silicon germanium channel region 60. The germanium concentration at the source end E1 of the graded silicon germanium region 60 may range from 10% to 80%. In other examples, the germanium concentration at the source end E1 of the graded silicon germanium region 60 may range from 20% to 50%. A gate structure 75, 80 is present on the graded silicon germanium channel region 60. A source region 65a is adjacent to the source end of the graded silicon germanium channel region 60, and a drain region 65b adjacent to the drain end of the graded silicon germanium channel region 60. The semiconductor device of claim 11, wherein the source region and the drain region 65a, 65b may be composed of p-type semiconductor material. The source region 65a and the drain region 65b may be composed of a semiconductor composition selected from the group consisting of germanium, silicon germanium, silicon, silicon doped with carbon, silicon germanium doped with carbon, type III-V semiconductors and combinations thereof.

The germanium (Ge) concentration at the source end E1 of the graded silicon germanium channel region 60 provides hole mobility for p-type semiconductor devices that is higher than hole mobility when the source end E1 of the channel region comprised entirely of silicon (Si). The germanium concentration at a source end E1 of the channel region 60 can range from $5 \times 10^{21}$ atoms/cm$^3$ to $4 \times 10^{22}$ atoms/cm$^3$. A germanium (Ge) deficient composition, e.g., 100% silicon composition, at the drain end E2 of the graded silicon germanium channel region 60 provides resistance to gate induced drain leakage current when compared to a germanium concentration greater than 0% drain end E2. The germanium concentration at the drain end E2 can be equal to 0%, or substantially close to 0%. In some embodiments, a composition of germanium in the graded silicon germanium region 60 decreases substantially uniformly from a high germanium concentration at the source end to said germanium deficient at the drain end of the channel region at a rate ranging from 5 to 30 nm per decade of germanium concentration depending on drive-in thermal budget. In one example, the composition of germanium in the graded silicon germanium region 60 decreases substantially uniformly from a high germanium concentration at the source end to said germanium deficient at the drain end of the channel region at a rate of 10 nm per decade of germanium concentration depending on drive-in thermal budget.

Although the semiconductor device 100 depict in FIG. 8 is a finFET, the methods and structures are not limited to only this device type. The semiconductor device 100 may also be a planar semiconductor MOSFET, a component of a SRAM device or a combination thereof.

The methods and structures that have been described above with reference to FIGS. 1A-8 may be employed in any electrical device including integrated circuit chips. The integrated circuit chips including the disclosed structures and formed using the disclosed methods may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processor.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor device comprising:
    forming a gate structure on a channel region of a silicon containing fin structure;
    forming an etch mask covering a drain side of the gate structure and the silicon containing fin structure;
    etching a source side of the silicon containing fin structure adjacent to the channel region;
    forming a germanium containing semiconductor material on an etched sidewall of the silicon containing fin structure adjacent to the channel region;
    diffusing the germanium from the germanium containing semiconductor material into the channel region to provide a graded silicon germanium region in the channel region having germanium present at a highest concentration in the channel region at the source end of the channel region and a germanium deficient concentration at the drain end of the channel region; and
    forming source and drain regions.

2. The method of claim 1, wherein the silicon fin structure is formed from a semiconductor containing substrate comprises an SOI substrate having a silicon layer atop a buried oxide layer, the buried oxide layer being atop a supporting substrate.

3. The method of claim 1, wherein a germanium concentration at the source end of the channel region provides hole mobility for p-type semiconductor devices that is higher than hole mobility when the source end of the channel region comprised entirely of silicon.

4. The method of claim 1, wherein a silicon concentration at the drain end of the channel region provides resistance to gate induced drain leakage current when compared to a germanium containing composition material at the drain end.

5. The method of claim 1, wherein forming the etch mask comprises:
    blanket depositing a nitride containing layer;
    forming a photoresist layer over the nitride containing layer;
    patterning the photoresist layer to cover said drain side of the gate structure and the silicon containing fin structure; and
    removing a portion of the nitride containing layer not covered by a patterned photoresist layer and the gate structure with an etch process to expose the source side of the silicon containing fin structure.

6. The method of claim 1, wherein etching the source side of the silicon containing fin structure comprises an anisotropic etch.

7. The method of claim 1, wherein forming the germanium containing semiconductor material comprises an epitaxial growth process.

8. The method of claim 1, wherein said diffusion of the germanium from the germanium containing semiconductor material into the channel region to provide the graded silicon germanium region comprising annealing at a temperature ranging from 800° C. to 1050° C.

9. The method of claim 1, wherein said diffusion of the germanium from the germanium containing semiconductor material into the channel region to provide the graded silicon germanium region comprising annealing selected from the group consisting of rapid thermal anneal, furnace anneal, laser anneal, and combinations thereof.

10. The method of claim 1, wherein forming source and drain regions comprises:
    etching source/drain trenches into the source and drain portions of the silicon containing fin structure on opposing sides of the gate structure; and
    epitaxially filling the trenches with n-type or p-type doped semiconductor material.

11. A method of forming a semiconductor device comprising:

forming an etch mask covering a drain side a silicon containing fin structure;

etching a source side of the silicon containing fin structure adjacent to the channel region;

forming a germanium containing semiconductor material on an etched sidewall of the silicon containing fin structure adjacent to the channel region;

diffusing the germanium from the germanium containing semiconductor material into the channel region to provide a graded silicon germanium region in the channel region having germanium present at a highest concentration in the channel region at the source end of the channel region and a germanium deficient concentration at the drain end of the channel region.

12. The method of claim 11, wherein the silicon fin structure is formed from a semiconductor containing substrate comprises an SOI substrate having a silicon layer atop a buried oxide layer, the buried oxide layer being atop a supporting substrate.

13. The method of claim 11, wherein a germanium concentration at the source end of the channel region provides hole mobility for p-type semiconductor devices that is higher than hole mobility when the source end of the channel region comprised entirely of silicon.

14. The method of claim 11, wherein a silicon concentration at the drain end of the channel region provides resistance to gate induced drain leakage current when compared to a germanium containing composition material at the drain end.

15. The method of claim 11, wherein forming the etch mask comprises:

blanket depositing a nitride containing layer;

forming a photoresist layer over the nitride containing layer;

patterning the photoresist layer to cover said drain side of the silicon containing fin structure; and removing a portion of the nitride containing layer not covered by a patterned photoresist layer with an etch process to expose the source side of the silicon containing fin structure.

16. The method of claim 11, wherein etching the source side of the silicon containing fin structure comprises an anisotropic etch.

17. The method of claim 11, wherein forming the germanium containing semiconductor material comprises an epitaxial growth process.

18. The method of claim 11, wherein said diffusion of the germanium from the germanium containing semiconductor material into the channel region to provide the graded silicon germanium region comprising annealing at a temperature ranging from 800° C. to 1050° C.

19. The method of claim 11, wherein said diffusion of the germanium from the germanium containing semiconductor material into the channel region to provide the graded silicon germanium region comprising annealing selected from the group consisting of rapid thermal anneal, furnace anneal, laser anneal, and combinations thereof.

20. The method of claim 11, wherein forming source and drain regions comprises:

etching source/drain trenches into the source and drain portions of the silicon containing fin structure; and epitaxially filling the trenches with n-type or p-type doped semiconductor material.

* * * * *